United States Patent
Kim et al.

(10) Patent No.: US 8,486,830 B2
(45) Date of Patent: Jul. 16, 2013

(54) VIA FORMING METHOD AND METHOD OF MANUFACTURING MULTI-CHIP PACKAGE USING THE SAME

(75) Inventors: Dong Pyo Kim, Gyeonggi-do (KR); Kyu Ha Baek, Daejeon (KR); Kun Sik Park, Daejeon (KR); Lee Mi Do, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 395 days.

(21) Appl. No.: 12/835,289

(22) Filed: Jul. 13, 2010

(65) Prior Publication Data

US 2011/0097853 A1   Apr. 28, 2011

(51) Int. Cl.
*H01L 21/44* (2006.01)

(52) U.S. Cl.
USPC ............ 438/672; 438/98; 438/99; 438/609; 257/40; 257/E21.254; 257/E31.005; 257/E21.159; 977/755; 977/762

(58) Field of Classification Search
USPC .. 257/2, 98, 686, 723, 778, E21.854; 438/99, 438/106, 674, 677
See application file for complete search history.

(56) References Cited

U.S. PATENT DOCUMENTS

| 7,018,872 | B2 * | 3/2006 | Hirai et al. | 438/149 |
| 8,232,481 | B2 * | 7/2012 | Matsubara | 174/267 |
| 2006/0027934 | A1 * | 2/2006 | Edelstein et al. | 257/774 |
| 2006/0220230 | A1 * | 10/2006 | Tanaka et al. | 257/723 |
| 2009/0035940 | A1 | 2/2009 | Richardson et al. | |
| 2009/0093423 | A2 * | 4/2009 | Udayampalayampalanisamy et al. | 514/40 |

FOREIGN PATENT DOCUMENTS

| JP | 09-260307 A | 10/1997 |
| JP | 2008085098 | * 4/2012 |
| KR | 10-2000-0027773 A | 5/2000 |
| KR | 10-2009-0012466 A | 2/2009 |
| KR | 10-2009-0074512 A | 7/2009 |
| KR | 10-2009-0104825 A | 10/2009 |

OTHER PUBLICATIONS

Manabu Bonkohara, et al. "Current and Future Three-Dimensional LSI Integration Techonology by 'Chip on Chip', 'Chip on Wafer' and 'Wafer on Wafer'" on Mater. Res. Soc. Symp. Proc., vol. 970, 2007, pp. 35-45.

Jong Woong Kim, et al., "Fabrication and Electrical Characterization of Through-Si-vai Interconnect for 3-D Packaging," on J.Micro/Nanolith. MEMS MOEMS, vol. 8 No. 1, Jan.-Mar. 2009, pp. 0313040-1-0313040-8.

* cited by examiner

*Primary Examiner* — Evan Pert
*Assistant Examiner* — Mark A Laurenzi
(74) *Attorney, Agent, or Firm* — Rabin & Berdo, P.C.

(57) ABSTRACT

A via forming method that includes forming via-holes in a substrate is provided. The method includes putting the substrate, having the via-holes, in a first solution to fill the via-holes with the first solution. Metal particles are sunk into the via-holes by supplying a second solution containing the metal particles to the first solution. A first curing process of heat-treating the substrate is performed so as to form vias in the via-holes. A multi-chip package that includes the substrate having the vias is also provided.

20 Claims, 6 Drawing Sheets

VIA FORMING METHOD AND METHOD OF MANUFACTURING MULTI-CHIP PACKAGE USING THE SAME

CROSS-REFERENCE TO RELATED APPLICATIONS

This application claims priority under 35 U.S.C. §119 to Korean Patent Application No. 10-2009-0102999, filed on Oct. 28, 2009 in the Korean Intellectual Property Office, the disclosure of which is incorporated herein by reference in its entirety

BACKGROUND OF THE INVENTION

1. Field of the Invention

The present invention relates to a via forming method and a method of manufacturing a multi-chip package using the same, and in particular, to a via forming method and a method of manufacturing a multi-chip package using the same which use a solution containing metal particles.

2. Description of the Related Art

A semiconductor chip includes active elements or passive elements which are connected to each other by various forms of wiring lines. With the Recent improvement in the degree of integration of a package structure with a reduction in the size of electronic products and improvement in the performance of electronic products, multi-chip packages in which multiple semiconductor chips are stacked are being released. In this case, multiple semiconductor chips may be connected to each other by wiring lines.

Wiring lines connect elements on the same level or connects elements on different levels vertically. Wiring lines for a vertical connection may be formed in various ways. Vertical wiring lines in a semiconductor chip may be formed by forming holes in an interlayer insulating layer, depositing a conductive layer to fill the holes, and performing etching so that portions of the conductive layer inside the holes remain. When the conductive layer is formed of copper, damascening is performed instead of etching.

In multi-chip packages, in order to electrically connect semiconductor chips on different levels, wire bonding or vias through semiconductor chips are used. Recently, with an improvement in the degree of integration of packages, wiring using vias is in the limelight. Such via-holes are formed by electroplating, laser reflow, dipping, etc. Since a laser reflow or dipping process needs high-pressure of 5 Mpa or greater while forming via, electroplating is generally used and will be described below in detail.

FIGS. 1 and 2 are cross-sectional views illustrating processes of a via forming method according to the related art.

Referring to FIG. 1, an insulating layer 12 is formed on a semiconductor substrate 10 having an active surface on which electric elements have been formed. Then, patterning on a predetermined area of the semiconductor substrate 10 is performed to form via-holes 11. Subsequently, an insulating layer 14 is formed on the inside surface of the via-holes 11.

Then, a seed layer 16 is formed on the inside surface of the via-holes 11. The seed layer 16 may be formed of copper. Next, copper is deposited on the seed layer 16 by electrolytic copper plating to form vias 18 filling the via-holes 11. In this case, copper is deposited not only in the via-holes 11 but also on the surface of the semiconductor substrate 10, resulting in an over burden layer 20.

Referring to FIG. 2, the over burden layer 20 is removed by a chemical mechanical polishing (CMP) process 22 to expose the vias 18 and the surface of the semiconductor substrate 10.

If the vias 18 are formed of another material instead of copper, etching is used to remove an over burden layer 20.

When electroplating according to the related art is used to form the vias 18, the seed layer 16 should be formed inside the via-holes 11, which makes forming of the vias 18 complicated. Moreover, electroplating takes a long time, and forms a seam or a void in the vias 18, which causes an increase in wiring resistance, when the aspect ratio of the via-holes 11 increases.

Also, electroplating involves a separate process for removing the over burden layer 20 such as a CMP process or an etching process mentioned above. In a case of the CMP process, in order to prevent damage to an underlying layer, it is required to additionally form a polishing stop layer on the semiconductor substrate 10 or to accommodate for a process time if there is no polishing stop layer. That is, the above-mentioned process makes forming of vias 18 more complicated.

SUMMARY OF THE INVENTION

It is an object of the present invention to provide a via forming method which simplifies a manufacturing process and prevents wiring resistance from increasing to improve reliability.

It is another object of the present invention to provide a method of manufacturing a multi-chip package which simplifies a manufacturing process and prevents wiring resistance from increasing to improve reliability.

The object of the present invention is not limited to the above-mentioned objects but other objects will be apparent to those skilled in the art from the following description.

According to an aspect of the present invention, it is provided a via forming method including: forming via-holes in a substrate; putting the substrate having the via-holes in a first solution to fill the via-holes with the first solution; sinking the metal particles into the via-holes by supplying a second solution containing metal particles to the first solution, in which there is the substrate; and performing a first curing process of heat-treating the substrate having the via-holes filled with the metal particles so as to form vias in the via-holes.

In some embodiments of the present invention, the metal particles may include any one selected from a group including copper, silver, gold, and tin.

In other embodiments of the present invention, a solvent of the second solution may have a density the same as or higher than the first solution.

In other embodiments of the present invention, the first solution may contain ethanol, methanol, or isopropyl alcohol.

In other embodiments of the present invention, the first curing process is performed at a temperature the same as or higher than the boiling point of the mixture of the first solution and the second solution.

In other embodiments of the present invention, before the performing of the first curing process, removing the metal particles deposited on the surface of the substrate by using a squeezer.

In other embodiments of the present invention, removing the metal particles deposited on the surface of the substrate by using a squeezer when sinking the metal particles.

In other embodiments of the present invention, a wiring pattern on the vias may be formed by using an imprint process or a print process using a conductive paste, and a second curing process of heat-treating the substrate having the wiring pattern may be performed.

The vias may be formed to have a level lower than the via-holes and the wiring pattern may be formed to have recess parts on the vias by the second curing process.

In other embodiments of the present invention, before the forming of the via-holes in the substrate, an insulating layer and a diffusion barrier film may be sequentially formed on the inside surfaces of the via-holes.

According to another aspect of the present invention, it is provided a method of manufacturing a multi-chip package, the method including: forming via-holes in a substrate; putting the substrate having the via-holes in a first solution to fill the via-holes with the first solution, thereby removing air bubbles inside the via-holes in a state in which the substrate is in the first solution; sinking the metal particles into the via-holes by supplying a second solution containing metal particles to the first solution, in which there is the substrate; performing a first curing process of heat-treating the substrate having the via-holes filled with the metal particles so as to form vias in the via-holes; and electrically connecting the lower parts of the via-holes to a wiring board by bumps.

In some other embodiments of the present invention, a re-wiring layer on the vias may be formed by using an imprint process or a print process using a conductive paste, and a second curing process of heat-treating the substrate having the re-wiring layer may be performed.

The vias may be formed to have a level lower than the via-holes and the re-wiring layer may be formed to have recess parts on the vias by the second curing process. A semiconductor chip having electronic elements may be stacked on the substrate and be electrically connected to the substrate by inserting bumps formed on a rear surface of the semiconductor chip into the recess parts.

The details of the embodiments are included in the specification and drawings.

According to the embodiments of the present invention, a solution containing metal particles is supplied into via-holes of a substrate and the substrate is heat-treated at a low temperature. Therefore, it is possible to form vias in a short time. Further, before a solution containing metal particles is supplied, via-holes are filled with a predetermined solution to remove air bubbles inside the via-holes. Therefore, it is possible to form vias having high reliability without forming any seams or voids in via-holes. Furthermore, since the heat-treating is performed at a low temperature to prevent an underlying layer from being damaged, it is possible to ensure the reliability of elements on the substrate.

Moreover, it is possible to form a re-wiring layer having recess parts on the vias by applying a paste on the vias and performing heat-treating at a low temperature. The recess parts improve the adhesion to bumps of a semiconductor chip staked on the substrate.

DETAILED DESCRIPTION OF THE PREFERRED EMBODIMENTS

Figure 1:
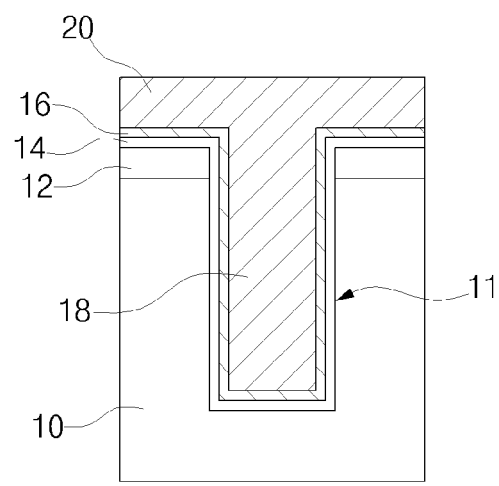
FIGS. 1 and 2 are cross-sectional views illustrating processes of a via-hole forming method according to the related art.
Figure 2:
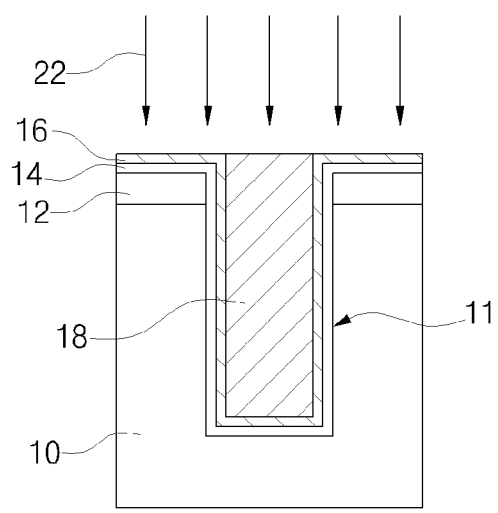

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 3:
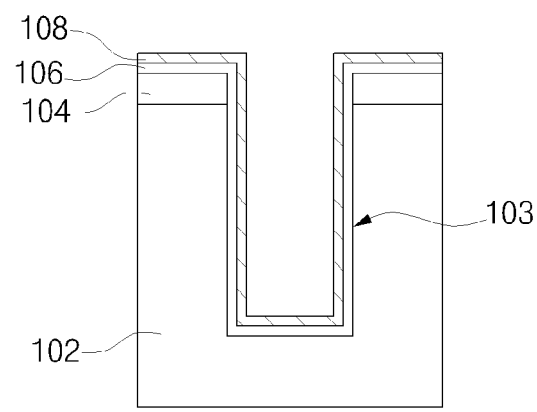
FIGS. 3 to 9 are cross-sectional views illustrating processes of a via forming method according to an embodiment of the present invention.

A via forming method according to an embodiment of the present invention will be described below in detail with reference to FIGS. 3 to 9. FIGS. 3 and 9 are cross-sectional views illustrating processes of a via forming method according to an embodiment of the present invention.

Referring to FIG. 3, a substrate 102 having an active surface and a rear surface is supplied. The substrate 102 may be a semiconductor substrate or a glass substrate and the semiconductor substrate may be a silicon substrate, an SOI (Silicon On Insulator) substrate or a compound semiconductor substrate. In the drawing, the active surface is an upper surface of the substrate 102 and is a surface where active elements or passive elements are formed on the active surface.

Next, an insulating layer 104 may be formed on the substrate 102 as a protective film covering the active surface. The insulating layer 104 may be a silicon oxide film, a silicon nitride film, or a polyimide film.

Subsequently, a mask pattern having openings, for example, an LTO mask pattern may be formed on a predetermined portion of the substrate 102 having the insulating layer 104. Then, etching may be performed on the insulating layer 104 and the substrate 102 exposed through the openings by using the mask pattern as an etch mask. In this case, DRIE (Deep Reactive Ion Etching) may be performed by using, for example, sulfuryl fluoride gas or oxygen gas. As a result, via-holes 103 having a predetermined depth are formed.

Subsequently, an insulating layer 106 may be formed on the inside surfaces of the via-holes 103 in order to electrically insulate vias to be formed inside the via-holes 103 from the substrate 102. The insulating layer 106 may be formed by a chemical vapor deposition (CVD) method using $O_3$-TEOS having superior step coverage.

Next, a diffusion barrier film 108 may be formed on the insulating layer 106 formed on the inside surfaces of the via-holes 103. The diffusion barrier film 108 may be made of a metal the same as or different from the vias to be formed thereafter. The diffusion barrier film 108 may be formed of tantalum, tatalium nitride, titanium, or titanium nitride, etc. The diffusion barrier film is formed in order to improve the contact property of a contact and prevent a metal material filling the via-holes 103 from being diffused into the substrate 102.

Figure 4:
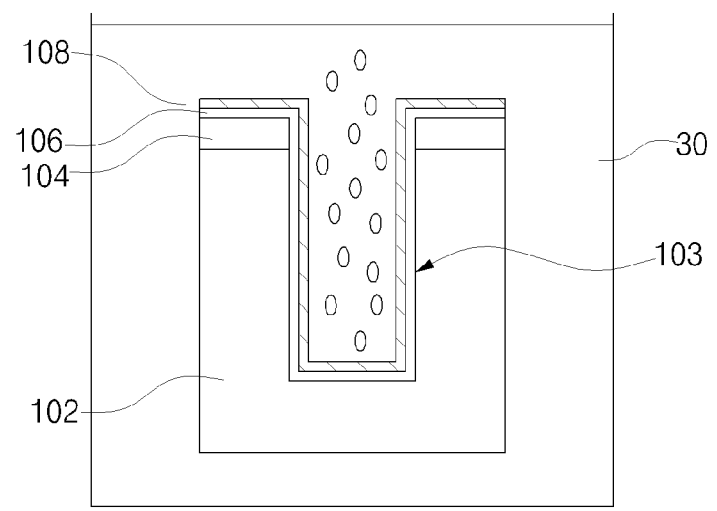

Referring to FIG. 4, the substrate 102 having the via-holes 103 is put in a liquid storage tank filled with a first solution 30. In this case, the whole substrate 102 is put in the solution during a predetermined time period to remove air bubbles generated inside the via-holes 103. That is, a pre-wetting process is performed such that the via-holes 103 are filled with a first solution 30 without air bubbles. The first solution 30 used in the pre-wetting process may be a solution that has stability so that etching reaction does not occur between the solution and the active surface of the substrate 102 and has a boiling point lower than a temperature at which wiring lines on the active surface develops a diffusion reaction. The first solution 30 may be alcohol such as ethanol, methanol, and isopropyl alcohol.

Figure 5:
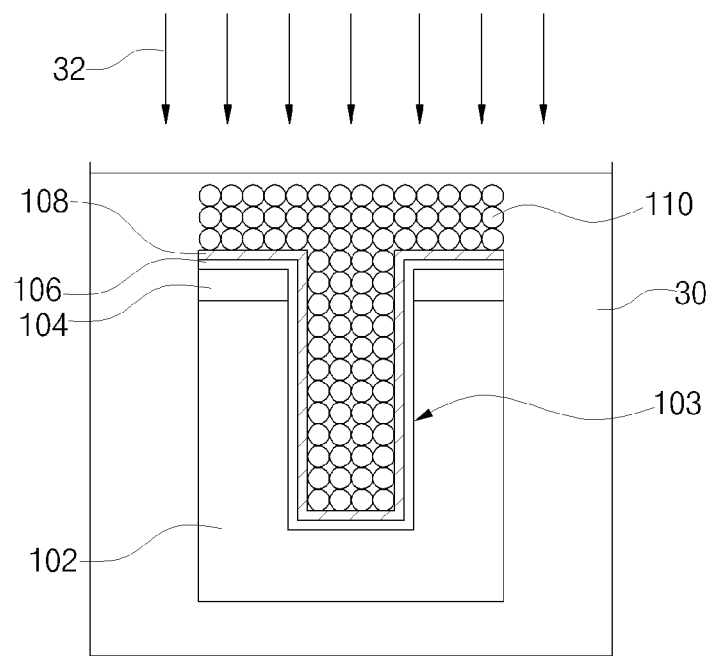

Referring to FIG. 5, a second solution 32 containing metal particles 110 is supplied to the liquid storage tank having the substrate 102 therein. The metal particles 110 may have a size of several tens nm to several hundreds nm and be any one selected from a group including copper, silver, gold, and tin. The second solution 32 may have a density higher than or the same as the first solution 30 and have stability and a low boiling point similar to the first solution 30. For example, the second solution 32 may be ethanol similar to the first solution 30.

As time elapses after the second solution 32 containing the metal particles 110 is supplied, the metal particles 110 freely sinks and deposits in the via-holes 103. The via-holes 103 can be filled with only the metal particles 110 without air bubbles because of the pre-wetting process.

Figure 6:
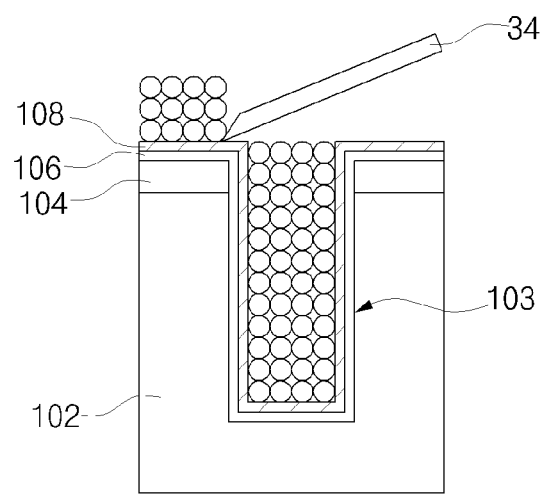

Referring to FIG. 6, in a process of taking the substrate 102 having the via-holes 103 filled with the metal particles 110 out of the liquid storage tank and drying the substrate 102, a process of scraping the surface of the substrate 102 by using a squeezer 34 may be performed. As a result, metal particles 110 on the surface of the substrate 102 are removed and metal particles 110 inside via-holes 103 remain. The process of removing the metal particles 110 by using the squeezer 34 may be performed while the substrate 102 is in the second solution 32.

Figure 7:
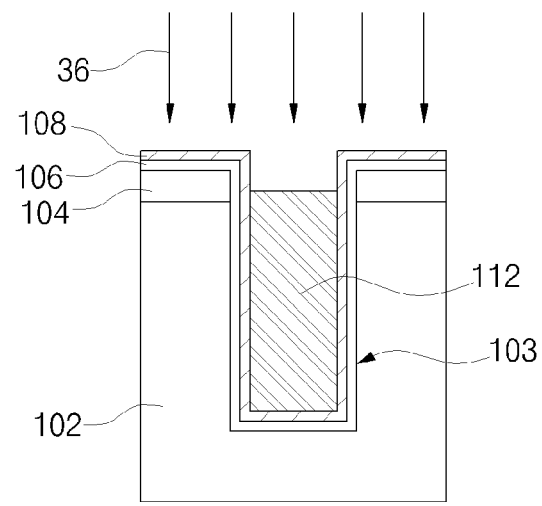

Referring to FIG. 7, a first curing process 36 is performed. In the first curing process 36, the substrate 102 having the via-holes 103 filled with the metal particles 110 is heat-treated at a predetermined temperature. The first curing process 36 may be performed at a temperature higher than the boiling points of the first and second solutions and lower than a temperature at which wiring lines on the active surface develops a diffusion reaction. For example, a temperature at which the first curing process 36 is performed may be in a range of about 80° C. to 120° C. When the first and second solutions are ethanol, the heat-treating may be performed at about 80° C.

As a result, the solution remaining inside the via-holes 103 are removed while the metal particles 110 are closely attached to one another, resulting in a reduction in the entire volume. The closely attached metal particles 110 form vias 112 without voids in the via-holes 103. In this case, the vias 112 may be formed to have a level lower than the via-holes 103 since the entire volume of the metal particles 110 is reduced. Meanwhile, since the first curing process 36 is performed at a low temperature as described above, it is possible to ensure reliability of the elements on the substrate.

Figure 8:
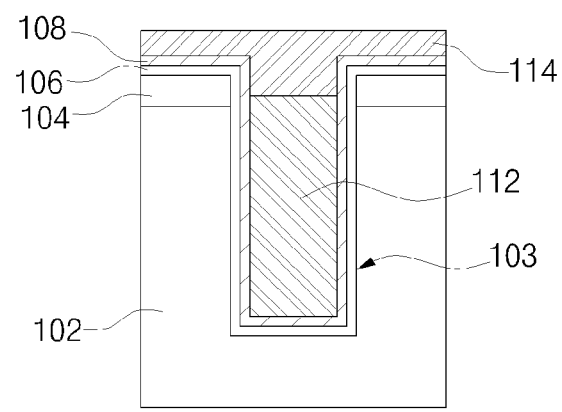
Figure 9:
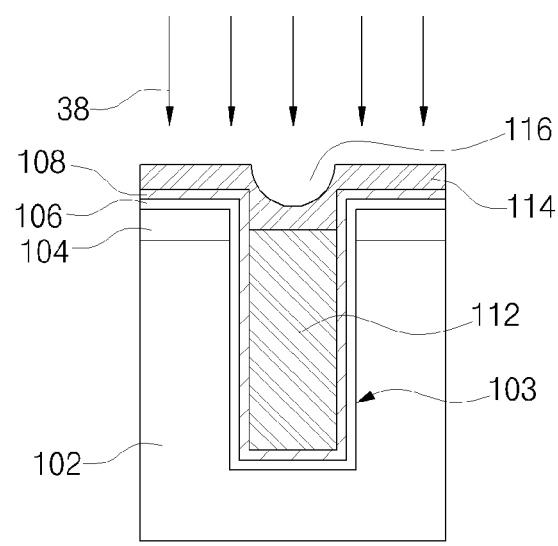

Referring to FIG. 8, a wiring pattern 114 to be electrically connected to conductive pads on the active surface may be formed on the vias 112. The wiring pattern 114 may be formed by a typical patterning process or by an imprint process or a print process using a conductive paste. In this case, the conductive paste may be formed of copper or silver. In the case of the imprint process or the print process, before the conductive paste is applied, a tin film may be additionally formed on the vias 112 for good contact property.

Referring to FIG. 9, a second curing process 38 may be performed. In the second curing process 38, the substrate 102 having the wiring pattern 114 may be heat-treated. The second curing process 38 may be performed at a temperature higher than the boiling points of the first solution and the second solution and lower than a temperature at which wiring lines on the active surface develops a diffusion reaction. For example, a temperature at which the second curing process 38 is performed may be in a range of about 120° C. to 350° C.

For example, when the vias 112 are formed of copper, the second curing process 38 may be performed at a temperature in a range of about 120° C. to 350° C. to improve the conductive property. When the vias 112 are formed of silver, the second curing process 38 may be performed at a temperature in a range of about 120° C. to 350° C. to deoxidize silver oxide in the via-holes 103 to silver, thereby improving the electrical properties.

The second curing process 38 reduces the entire volume of metal particles 110 of the conductive paste such that the wiring pattern 114 is formed according to the profile of the inside of the via-holes 103. As a result, the wiring pattern 114 may have recess parts 116 naturally formed on the vias 112.

The via forming method according to this embodiment for manufacturing a multi-chip package has been described as an example and is applicable to form contact plugs for vertical wiring in an active surface. Further, the step of putting the substrate having the via-holes in the first solution to fill the via-holes with the first solution is applicable to an electrolytic planting method, a non-electrolytic planting method, and a dual damascene process, which all contribute to form vias without voids or seams.

Figure 10:
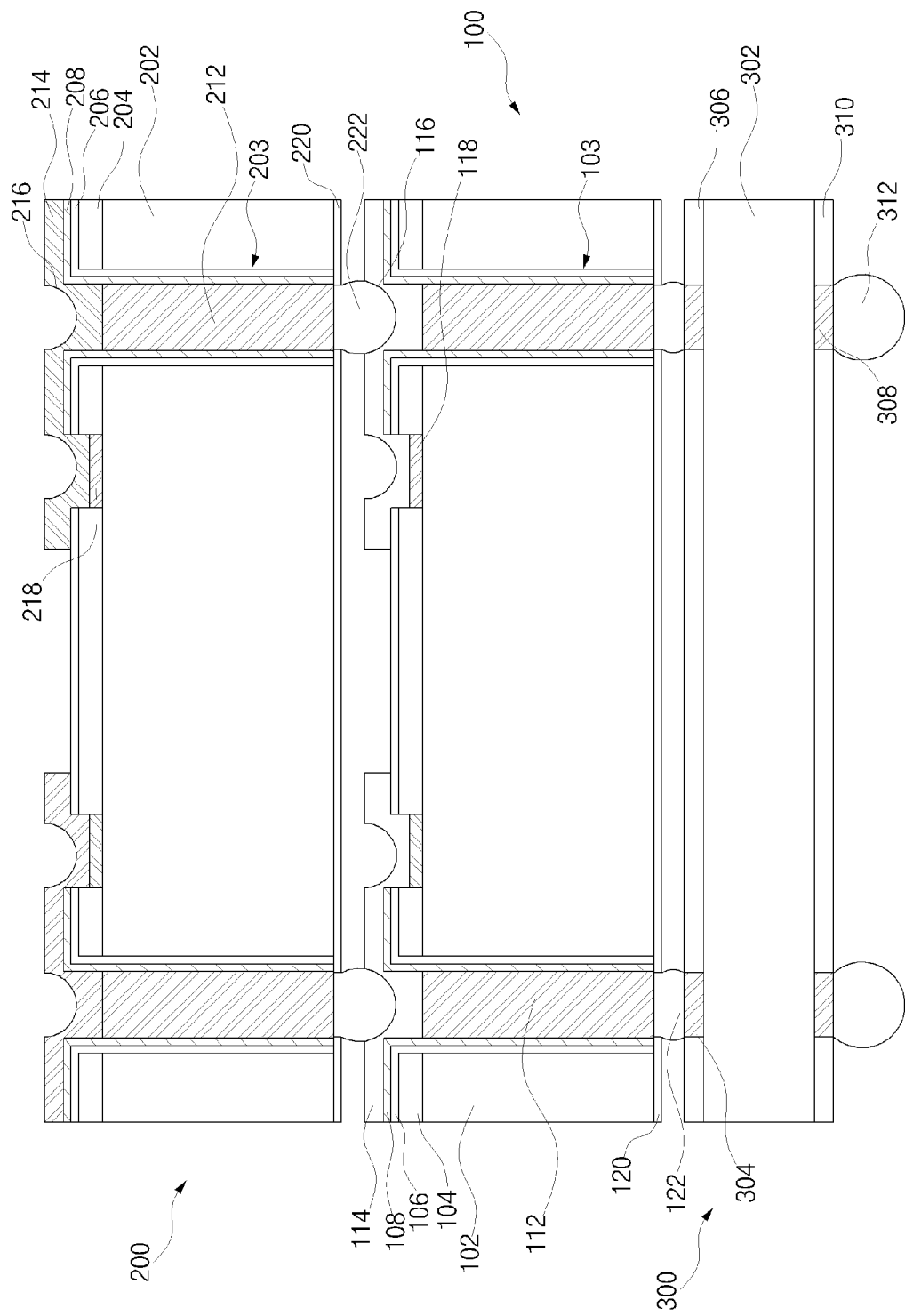
FIG. 10 is a cross-sectional view illustrating a multi-chip package manufactured by a method of manufacturing a multi-chip package according to an embodiment of the present invention.

A method of manufacturing a multi-chip package according to an embodiment of the present invention will be described below with reference to FIG. 10. FIG. 10 is a cross-sectional view illustrating a multi-chip package manufactured by a method of manufacturing a multi-chip package according to an embodiment of the present invention.

A first semiconductor chip 100 may be formed to have a first substrate 102 having an active surface and a rear surface, first via-holes 103 through the first substrate 102, first vias 112 filling the first via-holes 103, first chip pads 118 disposed on the active surface, and a first re-wiring pattern 114 which is a wiring pattern electrically connecting the first vias 112 to the first chip pads 118 and having first recess parts 116 on the first vias 112. Here, the active surface of the first semiconductor chip 100 may include a memory element, an image element, or a logical element.

The first via-holes 103, the first vias 112, and the first re-wiring pattern 114 may be formed by the via forming method according to the embodiment of the present invention and thus a description of a forming process thereof is omitted.

The rear surface of the first substrate 102 may be mechanically grinded to expose the first vias 112 from the rear surface. Alternatively, a portion of the rear surface may be removed by a CMP process or an etching process. Next, first bumps 122 may be formed on the first vias 112 exposed from the rear surface.

Meanwhile, a second semiconductor chip 200 is provided. The second semiconductor chip 200 may be formed to have a second substrate 202 having an active surface and a rear surface, second via-holes 203 through the second substrate 202, second vias 212 filling the second via-holes 203, second chip pads 218 disposed on the active surface, a second re-wiring pattern 214 which is a wiring pattern electrically connecting the second vias 212 to the second chip pads 218 and having second recess parts 216 on the second vias 212, and second bumps 220 connected to the lower parts of the second vias 212, similar to the first semiconductor chip 100. The second semiconductor chip 200 may be formed by a method substantially same as the method of manufacturing the first semiconductor chip 100.

In this case, in order to improve the degree of integration of a package, the second semiconductor chip 200 is stacked on the first semiconductor chip 100 and is electrically connected to the first semiconductor chip 100. This connection is accomplished by inserting the second bumps 220 of the second semiconductor chip 200 into the first recess parts 116 of the first semiconductor chip 100. Since the first recess parts 116 have a U shape, the contact property between the second bumps 220 and the first re-wiring pattern 114 is superior and the contact resistance is reduced.

Subsequently, the stacked semiconductor chips 100 and 200 are stacked on a wiring board 300 and are electrically connected to the wiring board 300. Here, the wiring board 300 may be formed to have a substrate body 302, an upper insulating layer 306 with openings on the top surface of the substrate body 302, and substrate pads 304 disposed in the openings of the upper insulating layer. The wiring board 300 may further include a lower insulating layer 310 having openings on the bottom surface of the substrate body 302, ball pads 308 disposed in the openings of the lower insulating layer, and conductive balls 312 electrically connected to the ball pads 308. In the drawing, a printed circuit board is shown as the wiring board 300. However, the wiring board 300 may be a tape wiring board, a ceramic wiring board, or a silicon wiring board.

The connection of the semiconductor chips 100 and 200 to the wiring board 300 is accomplished by connecting the first bumps 122 and the substrate pads 304.

Subsequently, the staked chips may be sealed in a package (not shown) to be protected from the outside. The package may be made of epoxy resin and formed by any one of a transfer molding method, an injecting molding method, a screen printing method, and a dispensing method.

Consequently, a multi-chip package in which the first and second semiconductor chips 100 and 200 are vertically stacked on the wiring board 300 is made.

Although the embodiments of the present invention have been described above with reference to the accompanying drawings, they are used in a generic and descriptive sense only and not for the purpose of limitation. It will be apparent to those skilled in the art that modifications and variations can be made in the present invention without deviating from the spirit or scope of the invention.

What is claimed is:

1. A via forming method comprising:
   forming via-holes in a substrate;
   putting the substrate in a first solution to fill the via-holes with the first solution;
   while the substrate is in the first solution, mixing a second solution containing metal particles with the first solution;
   sinking the metal particles contained in the mixed first and second solutions into the via-holes; and
   before the metal particles have formed vias, performing a first curing process of heat-treating the substrate having the via-holes filled with the metal particles so as to form vias in the via-holes.

2. The method according to claim 1, wherein said putting the substrate includes keeping the first solution in the via holes for a period of time so that air bubbles inside the via-holes are removed.

3. The method according to claim 1, wherein the metal particles include any particle selected from a group consisting of copper, silver, gold, and tin.

4. The method according to claim 1, wherein the second solution has a solvent having a density that is the same as or higher than the first solution, and the first solution contains ethanol, methanol, or isopropyl alcohol.

5. The method according to claim 1, wherein the first curing process is performed at a temperature that is the same as or higher than the boiling point of the mixture of the first solution and the second solution.

6. The method according to claim 1, wherein in the mixing, a portion of the metal particles is deposited on a surface of the substrate, the method further comprising before said performing a first curing process, removing the portion of the metal particles by using a squeezer in a state in which the substrate is in the mixture of the first solution and the second solution.

7. The method according to claim 1, wherein in the mixing, a portion of the metal particles is deposited on a surface of the substrate, the method further comprising removing the portion of metal particles by using a squeezer when sinking the metal particles in a state in which the substrate is in the mixture of the first solution and the second solution.

8. The method according to claim 1, further comprising:
   forming a wiring pattern on the vias by using an imprint process or a print process using a conductive paste; and
   performing a second curing process of heat-treating the substrate having the wiring pattern.

9. The method according to claim 8, wherein:
   in the first curing process, the vias are formed to have an uppermost surface thereof to be lower than an uppermost part of the via-holes, and
   in the second curing process, a recess is formed in the wiring pattern and on the vias.

10. The method according to claim 1, further comprising before said forming the via-holes in the substrate, sequentially forming an insulating layer and a diffusion barrier film on inside surfaces of the via-holes.

11. A method of manufacturing a multi-chip package, the method comprising:
    forming via-holes in a substrate;
    putting the substrate in a first solution to fill the via-holes with the first solution;
    while the substrate is in the first solution, mixing a second solution containing metal particles with the first solution;
    sinking the metal particles contained in the mixed first and second solutions into the via-holes;
    before the metal particles have formed vias, performing a first curing process of heat-treating the substrate having the via-holes filled with the metal particles so as to form vias in the via-holes; and
    electrically connecting the lower parts of the via-holes to a wiring board by bumps.

12. The method according to claim 11, wherein said putting the substrate includes keeping the first solution in the via holes for a period of time so that air bubbles inside the via-holes are removed.

13. The method according to claim 11, wherein the metal particles includes any particle selected from a group including copper, silver, gold, and tin.

14. The method according to claim 11, wherein the second solution has a solvent having a density that is the same as or higher than the first solution, and the first solution contains ethanol, methanol, or isopropyl alcohol.

15. The method according to claim 11, wherein the first curing process is performed at a temperature that is the same as or higher than the boiling point of the mixture of the first solution and the second solution.

16. The method according to claim 11, wherein in the mixing, a portion of the metal particles is deposited on a surface of the substrate, the method further comprising before said performing a first curing process, removing the portion of the metal particles by using a squeezer in a state in which the substrate is in the mixture of the first solution and the second solution.

17. The method according to claim 11, further comprising:
forming a re-wiring layer on the vias by using an imprint process or a print process using a conductive paste; and
performing a second curing process of heat-treating the substrate having the re-wiring layer.

18. The method according to claim 17, wherein in the first curing process, the vias are formed to have an uppermost surface thereof to be lower than an uppermost part of the via-holes, and
in the second curing process, a recess is formed in the re-wiring layer and on the vias.

19. The method according to claim 18, further comprising:
stacking a semiconductor chip having electronic elements on the substrate; and
electrically connecting the semiconductor chip to the substrate by inserting bumps formed on a rear surface of the semiconductor chip into the recess parts.

20. The method according to claim 11, further comprising before the forming of the via-holes in the substrate, sequentially forming an insulating layer and a diffusion barrier film on the inside surfaces of the via-holes.

\* \* \* \* \*